United States Patent
Harima (10) Patent No.: US 7,612,607 B2
(45) Date of Patent: Nov. 3, 2009

(54) SMALL SIZE POWER AMPLIFIER WITH AMPLIFIERS SWITCHED

(75) Inventor: Fumio Harima, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 19 days.

(21) Appl. No.: 11/905,857

(22) Filed: Oct. 4, 2007

(65) Prior Publication Data

US 2008/0111630 A1 May 15, 2008

(30) Foreign Application Priority Data

Oct. 5, 2006 (JP) .............................. 2006-274023

(51) Int. Cl.
*H03F 3/68* (2006.01)
(52) U.S. Cl. ..................... 330/124 R; 330/51; 330/302; 330/310
(58) Field of Classification Search ................. 330/51, 330/295, 302, 310, 124 R
See application file for complete search history.

(56) References Cited

U.S. PATENT DOCUMENTS

| 6,674,323 B2 * | 1/2004 | Kagaya et al. .......... 330/124 R |
| 6,781,455 B2 * | 8/2004 | Kim ....................... 330/124 R |
| 2004/0113698 A1 * | 6/2004 | Kim et al. ................. 330/295 |
| 2008/0231358 A1 * | 9/2008 | Maemura ................. 330/124 R |

FOREIGN PATENT DOCUMENTS

JP    2005-244862    9/2005

* cited by examiner

*Primary Examiner*—Khanh V Nguyen
(74) *Attorney, Agent, or Firm*—McGinn IP Law Group, PLLC

(57) ABSTRACT

A small size power amplifier includes a first amplifier provided for a first signal path; a second amplifier provided for said first signal path; and a third amplifier provided for a second signal path parallel to said first signal path. A voltage control circuit configured to bias one of a first set of said first amplifier and said second amplifier, and a second set of said third amplifier, based on an output power.

20 Claims, 7 Drawing Sheets

SMALL SIZE POWER AMPLIFIER WITH AMPLIFIERS SWITCHED

BACKGROUND OF THE INVENTION

1. Field of the Invention

The present invention relates to a small size power amplifier, more specifically to a small size power amplifier having a function of switching output power.

2. Description of the Related Art

Wireless communication performed by mobile phones or the like faces a problem of lack in a frequency band because of increase of the number of users and capacity increase in data communication. In order to improve frequency utilization efficiency for solving such a problem, a higher speed process and capacity increase have been in progress by using digital modulation techniques in recent years. In order to meet a strict requirement for the linearity of a signal in the digital modulation, operation with excellent linearity is required in power amplifiers used in wireless communication.

Figure 1:
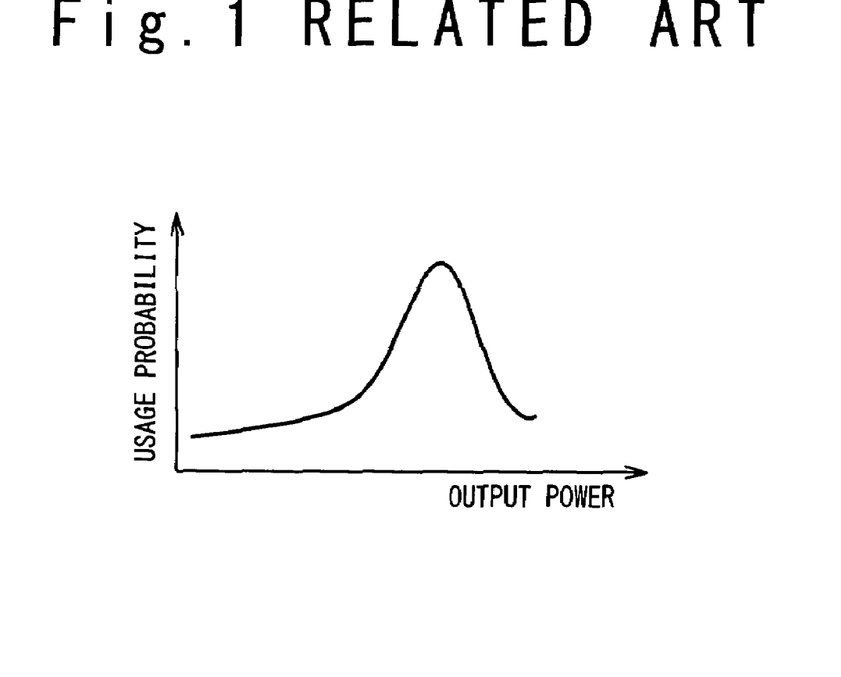
FIG. 1 is a diagram conceptually showing a distribution of a transmission power intensity of a mobile terminal in the third-generation mobile phone.

However, a power amplifier generally exhibits a high power-added-efficiency when operating nonlinearly in a high power state close to saturation output power, but power consumption relatively increases in operation with excellent linearity. Particularly, when the amplifier capable of maintaining linearity at high output power is used at a low output power, efficiency is extremely reduced. In a third-generation mobile phone system, a ratio of an operation time in a high output power of the power amplifier to an operation time in a low output power is small, though depending on modulation systems and purposes. As shown in FIG. 1, more operation time is spent in the low output power operation with a relatively large power consumption.

On the other hand, a mobile terminal is required to achieve a longer battery driving time and a smaller size. Though power consumption increases because of a higher terminal functionality, there is also a strong requirement for reduction of power consumption of a power amplifier which carries out wireless communication. For this reason, highly efficient operation needs to be achieved at low output power because of the above background.

Figure 2:
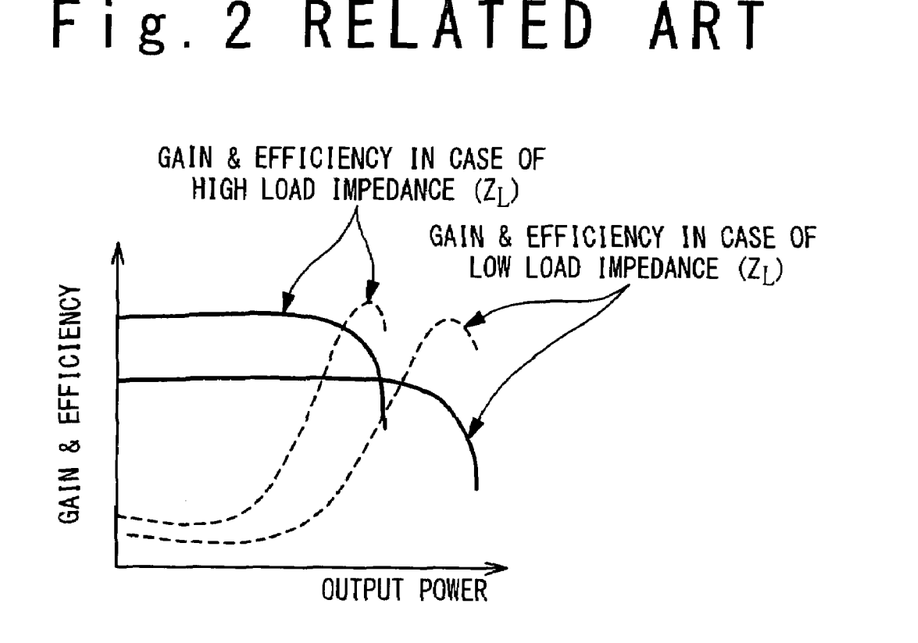
FIG. 2 is a diagram showing an example that a relation between a gain and output power and a power load efficiency is dependent on load impedance in a power amplifier.

Output power and power-added-efficiency of a power amplifier are determined based on load impedance, i.e., impedance when viewing an external circuit from the output end of the power amplifier. Generally, if the load impedance is decreased, the saturation output power can be set a high output power state. However, when a predetermined output power is desired, a high power-added-efficiency can be attained by increasing the load impedance and decreasing a saturation output power of the power amplifier to a desired output power (a smaller backoff amount state). In other words, as shown in FIG. 2, the high power-added-efficiency can be attained when the output power is immediately before the saturation output power of the power amplifier, while the efficiency is decreased if a desired output power is lower than the saturation output power (a larger backoff amount state). Usually, since a single amplifier is used from a low output power to a high output power, the saturation output power is designed to be compatible with the high output power. For this reason, an operation with low power-added-efficiency is unavoidable at low output power.

Moreover, it is necessary to enlarge the size of power amplifier for the high output power, and a bias (or idle) current is also increased at the same time, so that the power-added-efficiency is decreased particularly at low output power.

From these backgrounds, various techniques are proposed in which amplifiers are switched between a small amplifier having increased load impedance for a highly efficient operation at low output power and a large amplifier having decreased load impedance for highly efficient operation at high output power. Although there are proposed a method of using an externally attached switch and a method of using a $\lambda/4$ line, there is a problem in increase of a mount area in case of the externally attached parts. Therefore, it is desired to provide output power switching function suitable for miniaturization.

It should be noted that a technique to switch RF signal paths by use of a switch is known as a technique to switch a high efficient power amplifier at low output power and a high efficient power amplifier at high output power. However, in this technique, the number of parts, mounting area and costs are increased.

Figure 3:
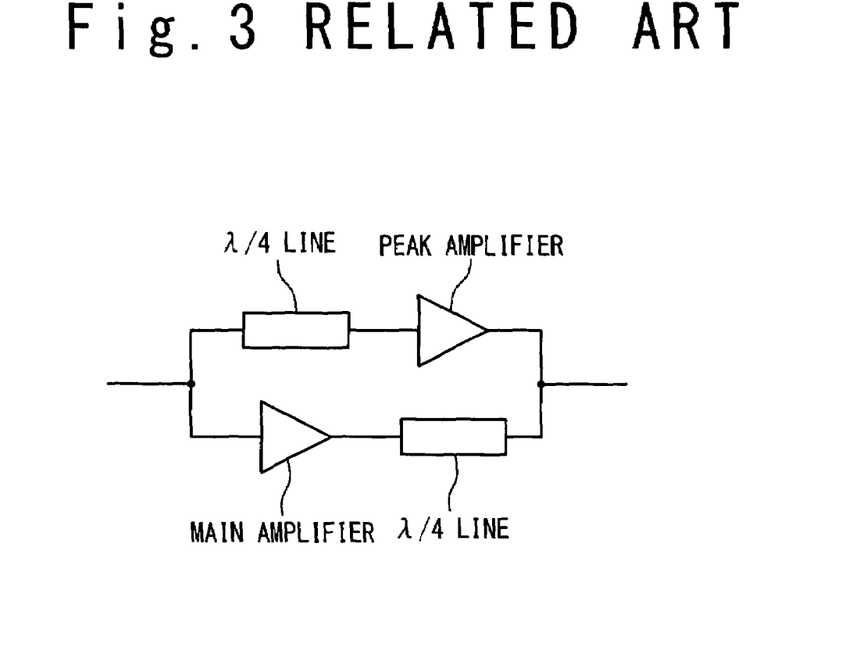
FIG. 3 is a diagram showing a general application example of a Doherty amplifier.

The Doherty amplifier shown in FIG. 3 is known as a circuit configuration to allow an efficiency improvement at low output power without using a switch. The Doherty amplifier is configured by arranging in parallel, a main amplifier which is biased to a class AB to operate from low output power and a peak amplifier which is biased to a class C to operate only at large output power. When an input power is small, the peak amplifier does not operate and only the main amplifier operates, and a load impedance is set to allow a highly efficient operation at low output power. When the input power is increased, the peak amplifier starts operating and performs a highly efficient operation at high output power. In order to realize these operations, impedance conversion is carried out by inserting a $\lambda/4$ line in the output of one of the amplifiers so as to achieve an optimum load impedance in the peak amplifier for high output power and in the main amplifier for low output power. Moreover, in order to prevent generation of a phase difference between outputs signals, a $\lambda/4$ line is inserted into the input of the other amplifier. Due to this configuration, the Doherty amplifier is effective in the power amplifier which needs to operate highly efficiently at low output power, but generally regarded as a circuit unsuitable for miniaturization due to the necessity of $\lambda/4$ lines.

Figure 4:
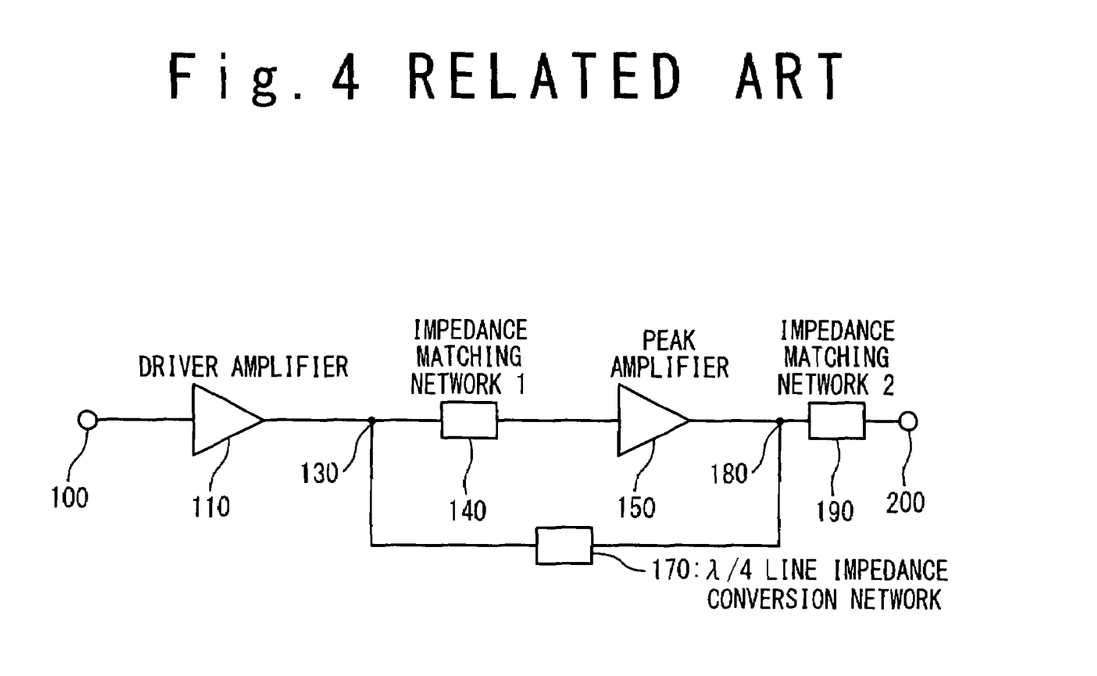
FIG. 4 is a circuit block diagram of an amplifier in a first related art.

Accordingly, another configuration is proposed in which the $\lambda/4$ line on an input side is omitted for miniaturization while utilizing operation principle of the Doherty amplifier. To be more specifically, as shown in FIG. 4, a circuit configuration example includes a port 100, a driver amplifier 110, a node 130, an impedance matching network 140, a peak amplifier 150, a $\lambda/4$ impedance conversion network 170, a node 180, an impedance matching network 190, and a port 200. Here, a first path is assumed be a signal path from the port 100 to the port 200 via the driver amplifier 110, the node 130, the impedance matching network 140, the peak amplifier 150, the node 180, and the impedance matching network 190. A second path is assumed to be a signal path from the port 100 to the port 200 via the driver amplifier 110, the node 130, the $\lambda/4$ impedance conversion network 170, and the impedance matching network 190. In the circuit shown in FIG. 4, the driver amplifier 110 is biased to a class AB and the peak amplifier 150 is biased to a class C. In a low RF input signal, load impedance to determine an output power of the driver amplifier is determined based on the $\lambda/4$ impedance conversion network 170 and designed to be highly efficient at low output power. Output power of the driver amplifier is increased and the peak amplifier which is biased to a class C starts operating. Load impedance to determine an output power of the peak amplifier is designed to be highly efficient at high output power. Due to the above operation principle, a highly efficient operation is realized at both low output power and high output power. This configuration has an advantage that while two of $\lambda/4$ lines are required in general Doherty amplifier, one of λ/4 lines can be omitted by arranging the driver amplifier and the peak amplifier in series.

Figure 5:
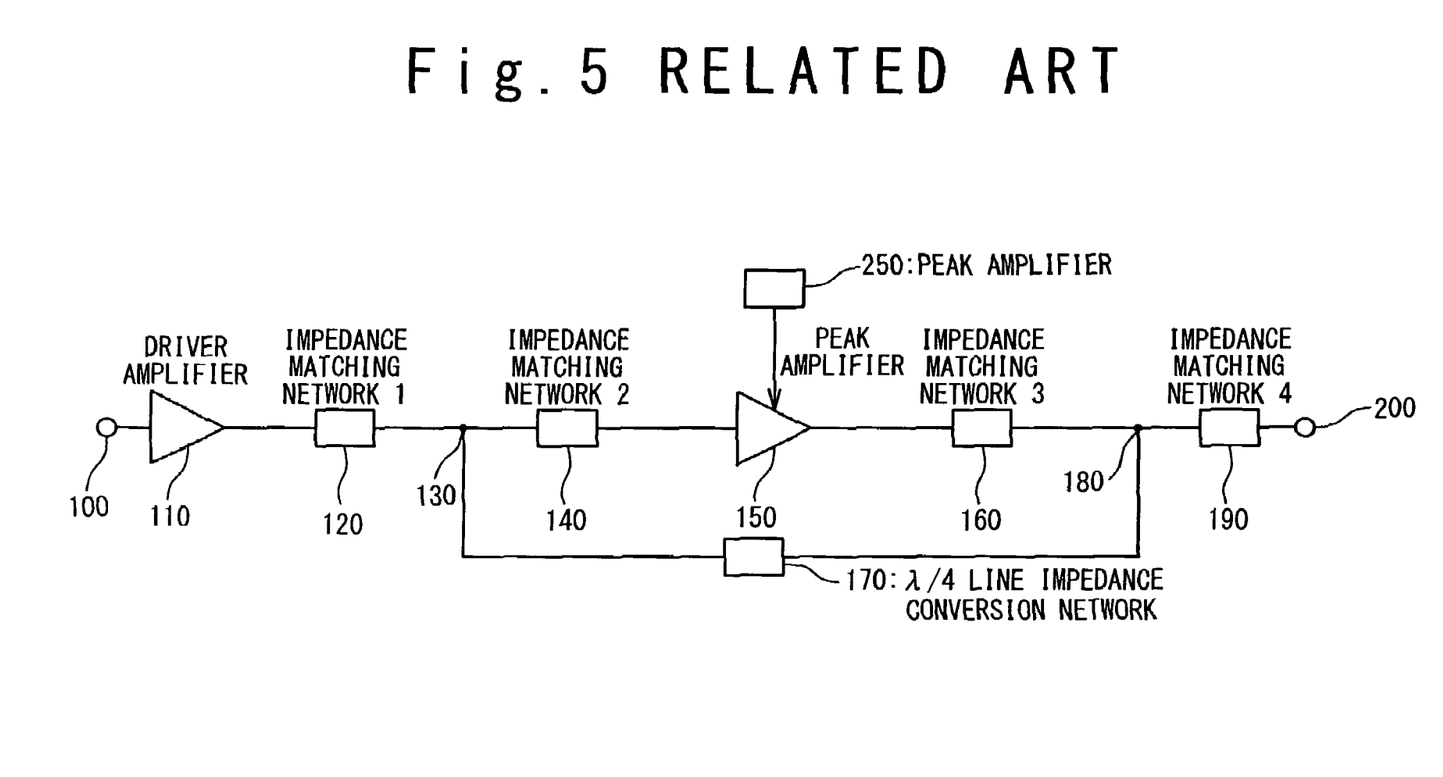
FIG. 5 is a circuit block diagram of an amplifier in a second related art.

A circuit similar to the above circuit is disclosed in Japanese Laid Open Patent application (JP-P2005-244862A: Related Art 1). FIG. 5 shows a configuration example of the circuit. As shown in FIG. 5, this circuit configuration example includes the port 100, the driver amplifier 110, an impedance matching network 120, the node 130, the impedance matching network 140, the peak amplifier 150, the impedance matching network 160, the λ/4 impedance conversion network 170, the node 180, the impedance matching network 190, the port 200, and a voltage control circuit 250. Here, a first path is assumed to be a signal path from the port 100 to the port 200 via the driver amplifier 110, the impedance matching network 120, the node 130, the impedance matching network 140, the peak amplifier 150, the impedance matching network 160, the node 180, and the impedance matching network 190. A second path is also assumed to be a signal path from the port 100 to the port 200 via the driver amplifier 110, the impedance matching network 120, the node 130, the λ/4 impedance conversion network 170, and the impedance matching network 190. Moreover, the peak amplifier 150 is connected to the voltage control circuit 250. The voltage control circuit 250 biases the peak amplifier 150 in accordance with an operation mode.

In conventional techniques, the peak amplifier is biased to a class C in order to dynamically switch an operation of the peak amplifier in accordance with input power. However, in the Related Art 1, the peak amplifier is not biased at low output power (is not operated) and is biased at the high output power by explicitly switching the operation mode. That is, the peak amplifier 150 is biased to an operation state at high output power, and an impedance when being viewed from the node 130 at this time is designed to be lower impedance in the impedance matching network 140 than that of the impedance conversion network 170. Accordingly, the RF signal is amplified by the peak amplifier and outputted to the port 200. The voltage control circuit 250 decreases a bias to the peak amplifier 150 at low output power to prevent the operation of the amplifier 150. Also, impedance when viewing the impedance matching network 140 from the node 130 is high so that the RF signal is outputted to the port 200 via the impedance conversion network 170.

The above circuit in the Related Art 1 is suitable for miniaturization since an externally attached member such as a switch is not used. Also, the circuit achieves suppression of power consumption since the peak amplifier is not biased at low output power. In this technique, like the Doherty amplifier, a technique is used which amplifiers are switched in accordance with output power by separating signal paths without using any switch.

As described above, in the Related Art 1, a circuit is proposed in which the number of λ/4 lines is decreased to one by arranging a main amplifier and a peak amplifier in series while applying Doherty amplifiers. The main amplifier is employed as a driver amplifier in this circuit, and the peak amplifier is bypassed at low output power, so that a function as a one-stage amplifier is exhibited. On the contrary, a function of two-stage amplifiers is exhibited because amplification operation is made in the peak amplifier in response to an output of the driver amplifier at high output power. Therefore, a significant discontinuity is observed in the entire power amplifier gain in the switching between the modes. Thus, even in Doherty amplifier or the switching by use of an RF switch, since gain differences exist between the peak amplifier having a load impedance for high power-added-efficiency at high output power and the main amplifier having a load impedance for high power-added-efficiency at low output power, a gain adjustment is required in general. In addition, when the power amplifier is actually used, it is required to control output power to a desired value. Therefore, an unnecessary control is generally required in the amplifier which has a significant discontinuity in the gain and a method of using the amplifier is limited.

SUMMARY

In a first embodiment of the present invention, a small size power amplifier includes a first amplifier provided for a first signal path; a second amplifier provided for said first signal path; a third amplifier provided for a second signal path parallel to said first signal path; and a voltage control circuit configured to bias one of a first set of said first amplifier and said second amplifier, and a second set of said third amplifier, based on an output power.

In a second embodiment of the present invention, a small size power amplifier includes a first port; a first matching circuit connected with said first port; a first node connected with said first matching circuit; a second matching circuit connected with said first node; a first amplifier connected with said second matching circuit; a third matching circuit connected with said first amplifier; a second amplifier connected with said third matching circuit; a fourth matching circuit connected with said second amplifier; a fifth matching circuit connected with said first node; a third amplifier connected with said fifth matching circuit; a sixth matching circuit connected with said third amplifier; a second node connected with said fourth matching circuit and said sixth matching circuit; a seventh matching circuit connected with said second node; a second port connected with said seventh matching circuit; and a voltage control circuit configured to bias one of a set of said first and second amplifiers ant a set of said third amplifier.

BRIEF DESCRIPTION OF THE DRAWINGS

The above and other objects, advantages and features of the present invention will be more apparent from the following description of certain embodiments taken in conjunction with the attached drawings, in which.

DESCRIPTION OF THE PREFERRED EMBODIMENTS

Hereinafter, a small size power amplifier according to the present invention will be described in detail with reference to the attached diagrams.

Figure 6:
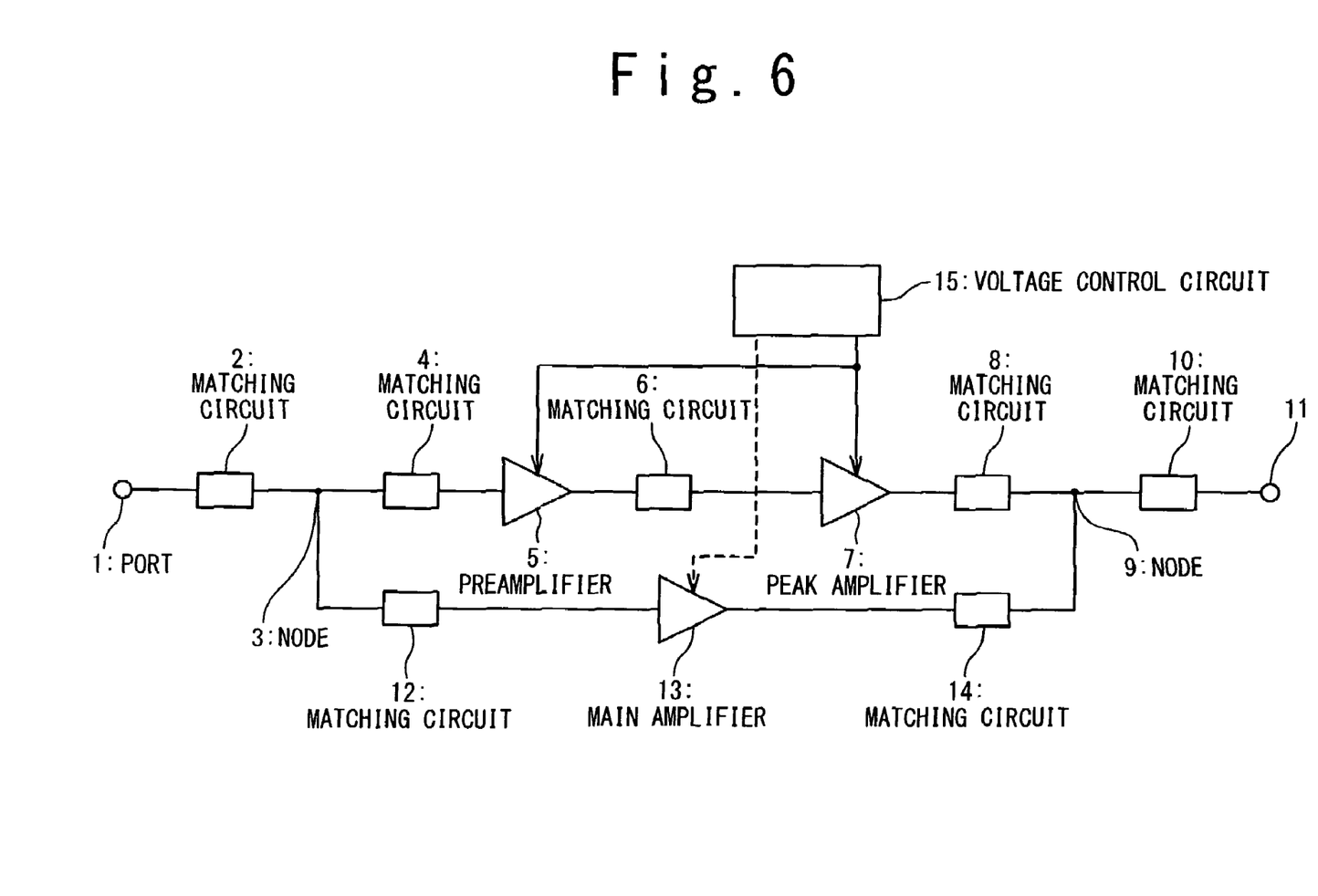
FIG. 6 is a circuit block diagram of a small size power amplifier according to the present invention.

Referring to FIG. 6, the small size power amplifier according to a first embodiment of the present invention will be described. As shown in FIG. 6, the small size power amplifier according to the present invention includes a port 1, a matching circuit 2, a node 3, a matching circuit 4, a preamplifier 5, a matching circuit 6, a peak amplifier 7, a matching circuit 8, a node 9, a matching circuit 10, a port 11, a matching circuit 12, a main amplifier 13, a matching circuit 14, and a voltage control circuit 15.

The matching circuit 2 is provided between the port 1 and the node 3, so that the matching circuit 4 is connected to the node 3. The preamplifier 5 is connected to the matching circuit 4. The matching circuit 6 is connected to the preamplifier 5. The peak amplifier 7 is connected to the matching circuit 6. The matching circuit 8 is provided between the peak amplifier 7 and the node 9. The matching circuit 10 is provided between the node 9 and the port 11. The matching circuit 12 is also connected to the node 3. The main amplifier 13 is connected to the matching circuit 12. The matching circuit 14 is provided between the main amplifier 13 and the node 9. Furthermore, the voltage control circuit 15 is provided so that the preamplifier 5, the peak amplifier 7 and the main amplifier 13 can be biased.

Here, a first path is assumed to be a signal path from the port 1 to the port 11 via the matching circuit 2, the node 3, the matching circuit 4, the preamplifier 5, the matching circuit 6, the peak amplifier 7, the matching circuit 8, the node 9, and the matching circuit 10. A second path is also assumed to be a signal path from the port 1 to the port 11 via the matching circuit 2, the node 3, the matching circuit 12, the main amplifier 13, the matching circuit 14, the node 9, and the matching circuit 10. An output load in the peak amplifier of the first path is designed to realize high power-added-efficiency at high output power, and an output load in the main amplifier of the second path is designed to realize high power-added-efficiency at low output power.

The preamplifier 5, the peak amplifier 7 and the main amplifier 13 are connected to the voltage control circuit 15. The voltage control circuit 15 biases one of the preamplifier 5 and the peak amplifier 7 in the first path, and the main amplifier 13 in the second path in accordance with an operation mode without biasing the other amplifier(s). That is, the amplifier(s) on either the first path or the second path is biased.

Figure 7:
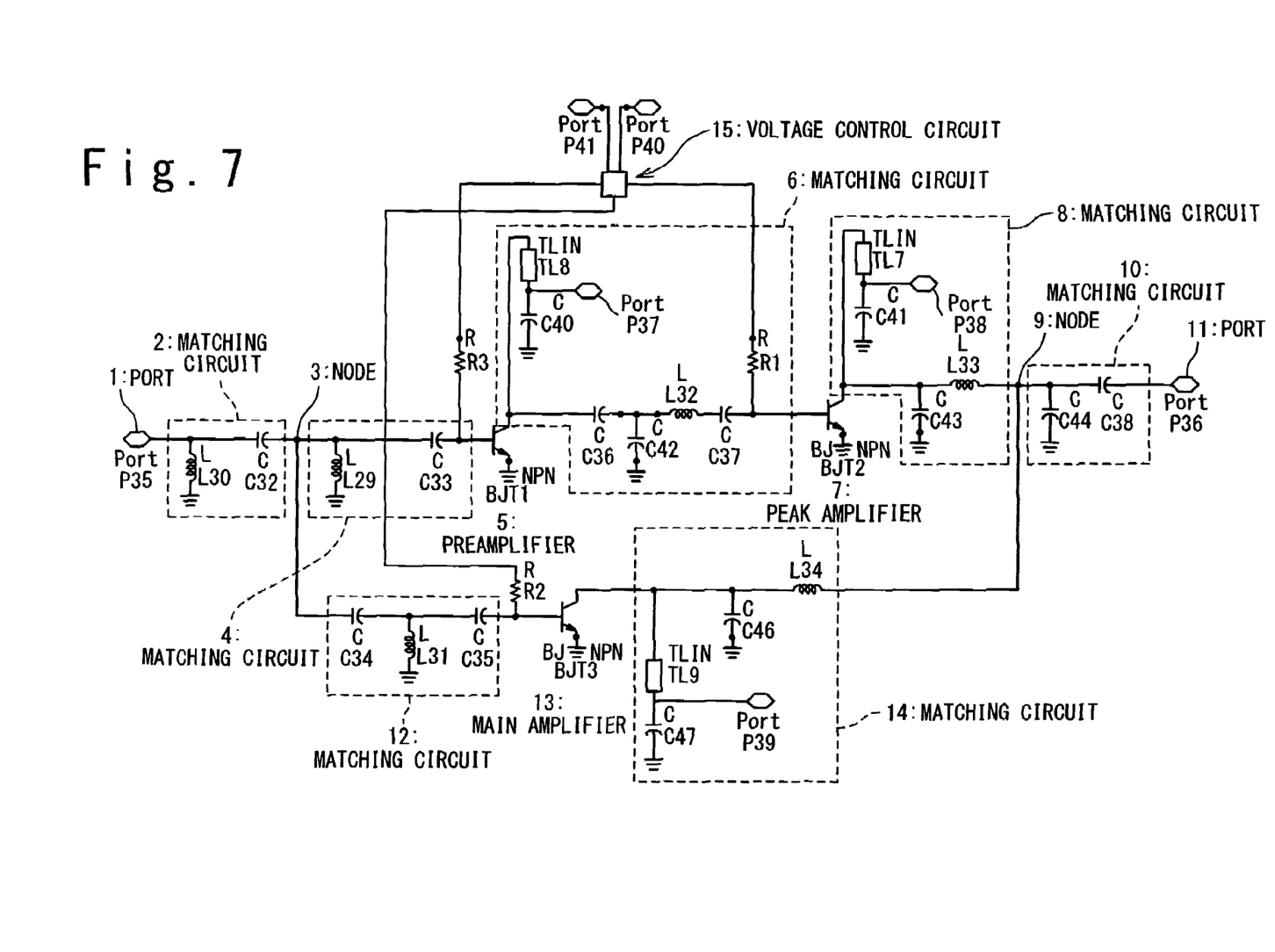
FIG. 7 is a detailed circuit diagram of the small size power amplifier according to the present invention.

A circuit configuration example of the small size power amplifier according to the present invention is shown in detail in FIG. 7. FIG. 7 is a detailed circuit diagram showing matching circuits and amplifiers in FIG. 6. Reference numerals in the respective circuits shown in FIG. 7 correspond to the reference numerals of the circuits in the block diagram shown in FIG. 6. In FIG. 7, each of the amplifiers (i.e. the preamplifier 5, the peak amplifier 7, and the main amplifier 13) is indicated by an NPN transistor whose collector is connected to a bias supply line and whose emitter is connected to a ground terminal (i.e. ground).

The matching circuit 2 has a coil L30 and a capacitor C32, and the coil L30 is provided between a port P35 (i.e. port 1) and a ground terminal (i.e. ground). The capacitor C32 is provided between the port P35 (i.e. port 1) and the node 3.

The matching circuit 4 has a coil L29 and a capacitor C33. The coil L29 is provided between the node 3 and a ground terminal (i.e. ground). The capacitor C33 is provided between the node 3 and the preamplifier 5. The capacitor C33 is connected to a base of an NPN transistor BJT1 as the preamplifier 5.

The matching circuit 6 has a transmission line TL8, a capacitor C40, capacitor C36, a capacitor C42, a coil L32, and a capacitor C37. The transmission line TL8 is provided between a port P37 and the preamplifier 5. The transmission line TL8 is connected to the collector of the NPN transistor BJT1 as the preamplifier 5. The capacitor C40 is provided between the transmission line TL8 and the ground terminal (i.e. ground). The transmission line TL8 and the capacitor C40 constitute a bias supply line. The capacitor C36 is connected to the collector of the NPN transistor BJT1 as the preamplifier 5. The capacitor C42 is provided between the capacitor C36 and the ground terminal (i.e. ground). The coil L32 is provided between the capacitor C36 and the capacitor C37. The capacitor C37 is connected to a base of an NPN transistor BJT2 as the peak amplifier 7.

The matching circuit 8 has a transmission line TL7, a capacitor C41, a capacitor C43 and a coil L33. The transmission line TL7 is provided between a port P38 and the peak amplifier 7. The transmission line TL7 is connected to the collector of the NPN transistor BJT2 as the peak amplifier 7. The capacitor C41 is provided between the transmission line TL7 and the ground terminal (i.e. ground). The transmission line TL7 and the capacitor C41 constitute a bias supply line. The capacitor C43 is provided between the peak amplifier 7 and the ground terminal (i.e. ground). The coil L33 is provided between the peak amplifier 7 and the node 9. The capacitor C43 and the coil L33 are connected to the collector of the NPN transistor BJT2 as the peak amplifier 7.

The matching circuit 10 has a capacitor C44 and a capacitor C38. The capacitor C44 is provided between the node 9 and the ground terminal (i.e. ground). The capacitor C38 is provided between the node 9 and a port P36 (i.e. the port 11).

The matching circuit 12 has a capacitor C34, a coil L31 and a capacitor C35. The capacitor C34 is connected to the node 3. The coil L31 is provided between the capacitor C34 and the ground terminal (i.e. ground). The capacitor C35 is provided between the capacitor C34 and the main amplifier 13. The capacitor C35 is connected to a base of an NPN transistor BJT3 as the main amplifier 13.

The matching circuit 14 has a transmission line TL9, a capacitor C47, a capacitor C46, and a coil L34. The transmission line TL9 is provided between a port P39 and the main amplifier 13. The transmission line TL9 is connected to a collector of the NPN transistor BJT3 as the main amplifier 13. The capacitor C47 is provided between the transmission line TL9 and the ground terminal (i.e. ground). The transmission line TL9 and the capacitor C47 compose a bias supply line. The capacitor C46 is provided between the main amplifier 13 and the ground terminal (i.e. ground). The coil L34 is provided between the main amplifier 13 and the node 9. The capacitor C46 and the coil L34 are connected to the collector of the NPN transistor BJT3 as the main amplifier 13.

The voltage control circuit 15 is connected to a node between the capacitor C33 of the matching circuit 4 and the preamplifier 5 via a resistor R3. The voltage control circuit 15 is also connected to a node between the capacitor C37 of the matching circuit 6 and the peak amplifier 7 via a resistor R1. The voltage control circuit 15 is further connected to a node between the capacitor C35 of the matching circuit 12 and the main amplifier 13 via a resistor R2. Furthermore, the voltage control circuit 15 is connected to a port P40 and port P41 so that amplifiers to bias are determined in accordance with output signals from each of the ports.

As clearly understood from the circuit configuration example shown in FIG. 7, the small size power amplifier of the present invention does not include any switch elements for switching in the signal paths. The small size power amplifier of the present invention switches the paths having different amplifier stages by corresponding to output power.

The circuit configuration example shown in FIG. 7 is merely an example which is exhibited to easily understand the present invention and the present invention is not limited to this circuit configuration example in practice.

Figure 8:
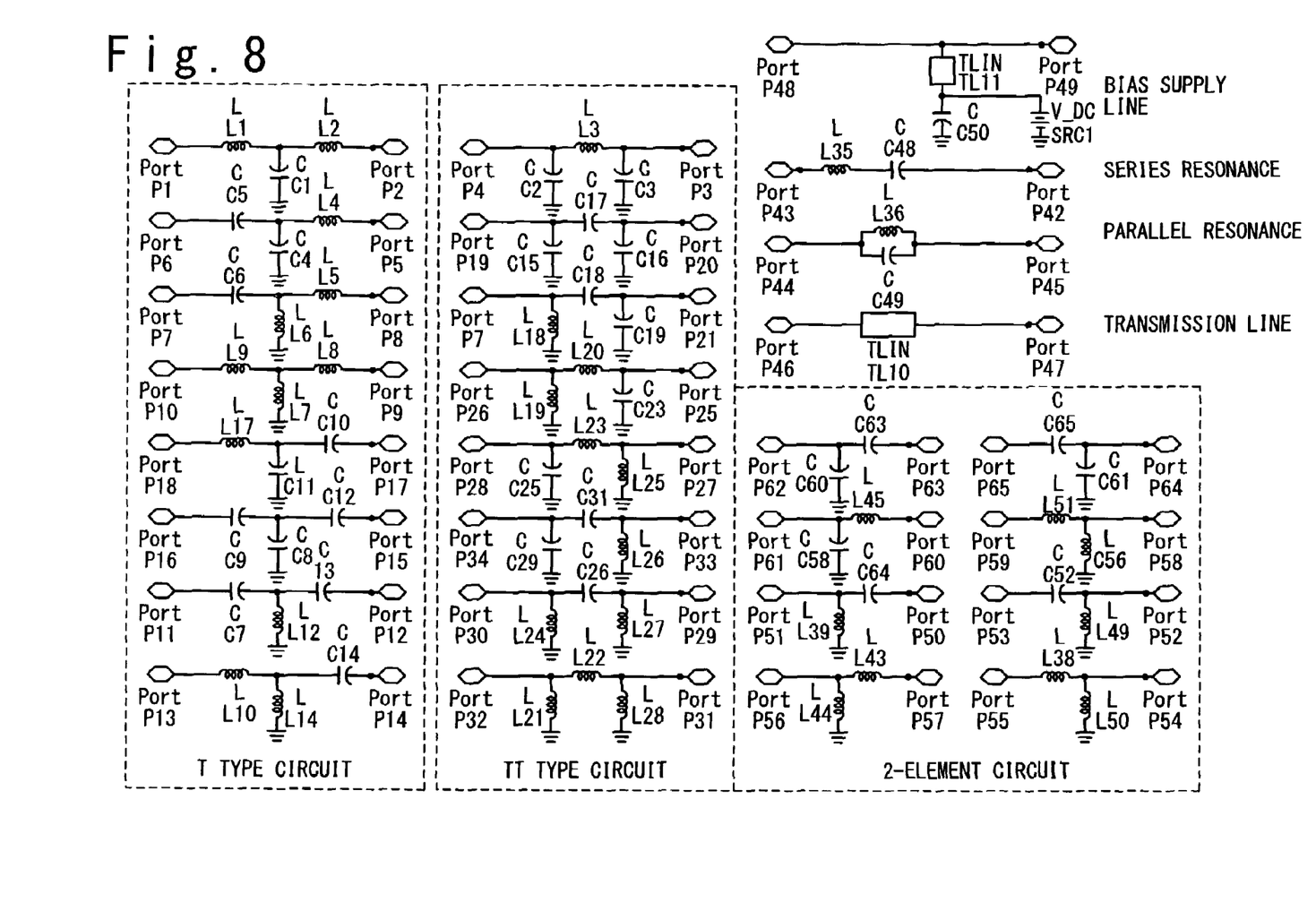
FIG. 8 is a diagram showing configuration examples of a matching circuit.

FIG. 8 shows a circuit configuration example of the matching circuits according to the present invention.

In FIG. 8, each circuit diagram of a T circuit, Π circuit and two-element circuit which are included in the matching circuits is individually shown. Elements, ports and nodes in the respective circuits are independent from each other. In the T circuit, a first element and a second element are provided between the first port and the second port, where a third element is provided between a node disposed between the first element and the second element and the ground terminal (i.e. ground). In the Π circuit, a first element is provided between the first port and the second port, where a second element is provided between a node disposed between the first port and a first element and the ground terminal (i.e. ground), and a third element is provided between a node disposed between the first element and the second port and the ground terminal (i.e. ground). In the two-element circuit, the first element is provided between the first port and the second port, where the second element is provided between a node disposed between the first element and the first element, or a node disposed between the first element and the second port, and the ground terminal (i.e. ground). Each of the elements used here is either a coil or a capacitor.

FIG. 8 also shows other individual circuit diagrams for each of the bias supply lines, series resonance, parallel resonance, and transmission lines. Elements, ports and nodes in the respective circuits are independent from each other. In the bias supply line, a transmission line is connected to a node between the first port and the second port. A capacitor is provided between the transmission line and a first ground terminal (i.e. ground), and a coil is provided between the transmission line and a second ground terminal (i.e. ground). In the series resonance, a coil is connected to the first port, where a capacitor is connected to the coil, and the second port is connected to the capacitor. In the parallel resonance, a coil and a capacitor are provided in parallel between the first port and the second port. The transmission line is provided between the first port and the second port.

In the matching circuits included in the small size power amplifier according to the present invention, the circuits shown in FIG. 8 are appropriately combined to realize desired impedance conversion. That is, the circuits used in the present invention can be replaced with the respective circuits shown in FIG. 8. The matching circuit 6, the matching circuit 8 and the matching circuit 14 are also configured so include the bias supply lines of the amplifiers as shown in FIG. 7.

Next, an operation of the small size power amplifier of the present invention will be described in detail.

Figure 9:
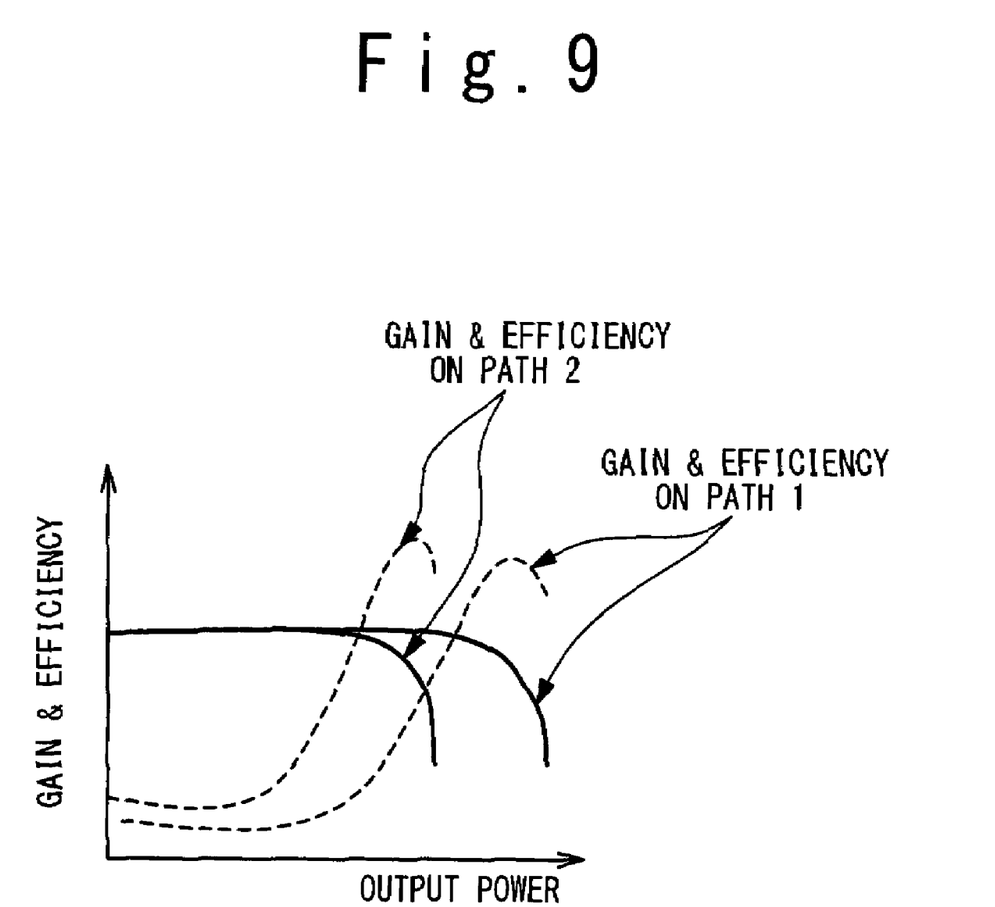
FIG. 9 shows examples of characteristics of a gain and output power and power load efficiency in the amplifier according to the present invention.

For switching between a highly efficient operation state in low output power (i.e. low output power mode) and a highly efficient operation state at high output power (i.e. high output power mode), a bias is switched to the preamplifier 5 and the peak amplifier 7 or the main amplifier 13 in accordance with a desired signal path of an RF signal by using the voltage control circuit 15 which receives external control signals. That is, the preamplifier 5 and the peak amplifier 7 are biased in high output power mode so that the RF signal is allowed to pass through the first path, without biasing the main amplifier 13. On the contrary, the main amplifier 13 is biased in low output power mode so that the RF signal is allowed to pass through the second path, without biasing the preamplifier 5 and the peak amplifier 7. At this time, the preamplifier 5, the matching circuit 4, and the matching circuit 6 are adjusted so that a gain when the RF signal passes through the first path can be made to be same as a gain when the RF signal passes through the second path. FIG. 9 typically shows a gain and power-added-efficiency in passing through the first path and the second path.

In the present embodiment, a gain of the first path can be adjusted by the preamplifier 5 and the matching circuits 4 and 6, so that a constant gain can be sustained even if the amplifiers are switched in accordance with output power, without having gain fluctuations in switching operation modes (paths).

Next, the small size power amplifier according to a second embodiment of the present invention will be described.

In the first embodiment of the present invention, an output load in the peak amplifier 7 of the first path is designed to realize high power-added-efficiency at high output power, and an output load in the main amplifier 13 of the second path is designed to realize high power-added-efficiency at low output power. At this time, loads are designed so that the first path becomes highly efficient at low output power and the second path becomes highly efficient at high output power by contraries, so that the first path is used in low output power mode and the second path is used at high output power. In this configuration, a path in low output power mode is configured by the preamplifier 5 and the peak amplifier 7 in two stages, so that it is made possible to adjust a gain in a case of having a low gain in low output power mode.

Next, the small size power amplifier according to a third embodiment of the present invention will be described below.

Although the first and second embodiments of the present invention provide the preamplifier 5 and the peak amplifier 7 in the first path and the main amplifier 13 in the second path, a plurality of these amplifiers may be provided respectively. At this time, the number of the amplifiers provided in the first path is set to be larger than the number of the amplifiers provided in the second path.

As described above, the small size power amplifier according to the present invention realizes an output power switching function to operate highly efficiently in accordance with output power in the RF power amplifiers. Moreover, in constructing amplifiers for low output power and amplifiers for high output power by using two paths, amplifiers configured by two stages are used in one of the paths and a one-stage amplifier is used in the other path. Since it is adjustable to have the same gain between the path of the two-stage configuration and the remaining path with the one-stage amplifier, gain fluctuations in switching operation modes (paths) can be prevented.

Although explanation was made here by using an example which exhibits a path configured by the two-stage amplifiers and a path configured by the one-stage amplifier in order to easily understand features of the present invention, there is no limitation for such an example in practice. It is also possible to use paths which are configured by amplifiers of multiple stages equal to or larger than two stages, where the number of the amplifiers in one of the paths shall be larger than the number of the amplifiers in the other path. At this time, the voltage control circuit biases the amplifiers disposed in either one of the paths so as to have the same gain in each of the paths.

In constructing amplifiers for use at low output power and amplifiers for use at high output power by using two paths, one of the paths is used for amplifiers configured by two stages and the other path is used for a one-stage amplifier, so that a path gain in the two-stage configuration can be adjusted to be equal to a path gain of the other one-stage amplifier without having gain fluctuations in switching operation modes (or paths).

Although the present invention has been described above in connection with several embodiments thereof, it will be appreciated by those skilled in the art that those embodiments are provided solely for illustrating the present invention, and should not be relied upon to construe the appended claims in a limiting sense.

What is claimed is:

1. A small size power amplifier comprising:
   a first amplifier provided for a first signal path;
   a second amplifier provided for said first signal path;
   a third amplifier provided for a second signal path parallel to said first signal path;
   a voltage control circuit configured to bias one of a first set of said first amplifier and said second amplifier, and a second set of said third amplifier, based on an output power; and
   a node that splits the second signal path from the first signal path, said node being connected to a first matching circuit and a second matching circuit, said first matching circuit and the second matching circuit being located in the first signal path prior to said first amplifier.

2. The small size power amplifier according to claim 1, wherein said voltage control circuit biases said first set of said first amplifier and said second amplifier without biasing said second set of said third amplifier at a high output power, and biases said second set of said third amplifier without biasing said first set of said first amplifier and said second amplifier at a low output power.

3. The small size power amplifier according to claim 1, wherein said voltage control circuit biases said first set of said first amplifier and said second amplifier without biasing said second set of said third amplifier at a low output power, and biases said second set of said third amplifier without biasing said first set of said first amplifier and said second amplifier at a high output power.

4. The small size power amplifier according to claim 1, wherein a number of said amplifiers in said first signal path is more than in said second signal path.

5. The small size power amplifier according to claim 1, wherein said voltage control circuit adjusts a gain of said power amplifier such that a gain of said first signal path is equal to that of said second signal path.

6. The small size power amplifier according to claim 1, wherein the first amplifier is connected with said second matching circuit.

7. The small size power amplifier according to claim 6, further comprising a third matching circuit,
   wherein the third matching circuit is connected with said first amplifier.

8. The small size power amplifier according to claim 7, wherein the second amplifier is connected with said third matching circuit.

9. The small size power amplifier according to claim 8, further comprising a fourth matching circuit,
   wherein said fourth matching circuit is connected with said second amplifier.

10. The small size power amplifier according to claim 9, further comprising a fifth matching circuit,
    wherein said fifth matching circuit is connected with said node.

11. The small size power amplifier according to claim 10, wherein the third amplifier is connected with said fifth matching circuit.

12. The small size power amplifier according to claim 11, further comprising a sixth matching circuit,
    wherein said sixth matching circuit is connected with said third amplifier.

13. The small size power amplifier according to claim 12, further comprising another node connected with said fourth matching circuit and said sixth matching circuit.

14. The small size power amplifier according to claim 13, further comprising a seventh matching circuit,
    wherein said seventh matching circuit is connected with said another node.

15. The small size power amplifier according to claim 1, wherein the voltage control circuit is connected to the first signal path, in a location placed between a capacitor of the second matching circuit and the first amplifier, via a resistor.

16. The small size power amplifier according to claim 1, wherein a number of amplifiers provided in the first signal path is larger than a number of amplifiers provided in the second signal path.

17. A small size power amplifier comprising:
    a first port;
    a first matching circuit connected with said first port;
    a first node connected with said first matching circuit;
    a second matching circuit connected with said first node;
    a first amplifier connected with said second matching circuit;
    a third matching circuit connected with said first amplifier;
    a second amplifier connected with said third matching circuit;
    a fourth matching circuit connected with said second amplifier;
    a fifth matching circuit connected with said first node;
    a third amplifier connected with said fifth matching circuit;
    a sixth matching circuit connected with said third amplifier;
    a second node connected with said fourth matching circuit and said sixth matching circuit;
    a seventh matching circuit connected with said second node;
    a second port connected with said seventh matching circuit; and
    a voltage control circuit configured to bias one of a set of said first and second amplifiers and a set of said third amplifier.

18. The small size power amplifier according to claim 17, wherein each of said third, fourth, sixth and seventh matching circuits includes a bias supply line.

19. A small size power amplifier comprising:
    a first matching circuit;
    a node connected with said first matching circuit;
    a second matching circuit connected with said node;
    a first amplifier connected with said second matching circuit;
    a third matching circuit connected with said first amplifier;
    a second amplifier connected with said third matching circuit;
    a fourth matching circuit connected with said second amplifier;

a fifth matching circuit connected with said node;

a third amplifier connected with said fifth matching circuit; and a voltage control circuit configured to bias one of a set of said first and second amplifiers and a set of said third amplifier.

20. The small size power amplifier according to claim 19, wherein the voltage control circuit is connected to a first signal path, in a location placed between a capacitor of the second matching circuit and the first amplifier, via a resistor.

* * * * *